United States Patent
Park

(10) Patent No.: US 8,227,815 B2
(45) Date of Patent: Jul. 24, 2012

(54) LIGHTING DEVICE

(75) Inventor: Jun Seok Park, Gwangju (KR)

(73) Assignee: LG Innotek Co., Ltd., Seoul (KR)

( * ) Notice: Subject to any disclaimer, the term of this patent is extended or adjusted under 35 U.S.C. 154(b) by 198 days.

(21) Appl. No.: 12/672,777

(22) PCT Filed: Jul. 28, 2008

(86) PCT No.: PCT/KR2008/004397
§ 371 (c)(1),
(2), (4) Date: Feb. 9, 2010

(87) PCT Pub. No.: WO2009/020298
PCT Pub. Date: Feb. 12, 2009

(65) Prior Publication Data
US 2011/0248292 A1    Oct. 13, 2011

(30) Foreign Application Priority Data

Aug. 9, 2007 (KR) .................. 10-2007-0080307

(51) Int. Cl.
*H01L 29/20* (2006.01)
(52) U.S. Cl. ............ 257/89; 257/88; 257/E33.012
(58) Field of Classification Search ............ 257/89
See application file for complete search history.

(56) References Cited

U.S. PATENT DOCUMENTS

| | | | |
|---|---|---|---|
| 5,162,696 A * | 11/1992 | Goodrich | 313/511 |
| 5,703,611 A * | 12/1997 | Kishino et al. | 345/75.2 |
| 5,754,149 A * | 5/1998 | Browning et al. | 345/75.2 |
| 5,760,810 A * | 6/1998 | Onodaka | 347/123 |
| 5,986,626 A * | 11/1999 | Tanaka | 345/75.2 |
| 6,154,362 A * | 11/2000 | Takahashi et al. | 361/695 |
| 6,437,664 B1 * | 8/2002 | Meppelink et al. | 333/182 |
| 6,473,148 B1 * | 10/2002 | Suh | 349/153 |
| 6,540,373 B2 | 4/2003 | Bailey | 362/150 |
| 6,611,635 B1 * | 8/2003 | Yoshimura et al. | 385/14 |
| 6,646,858 B2 * | 11/2003 | Dingenotto et al. | 361/302 |
| 6,764,196 B2 * | 7/2004 | Bailey | 362/147 |
| 6,860,647 B2 * | 3/2005 | Yamabayashi et al. | 385/88 |
| 6,936,855 B1 * | 8/2005 | Harrah | 257/88 |
| 6,970,612 B2 * | 11/2005 | Ouchi | 385/14 |
| 7,098,483 B2 * | 8/2006 | Mazzochette et al. | 257/81 |
| 7,102,290 B2 * | 9/2006 | Miyaji et al. | 313/607 |
| 7,112,115 B1 * | 9/2006 | Yamazaki et al. | 445/25 |
| 7,311,423 B2 * | 12/2007 | Frecska et al. | 362/372 |
| 7,690,809 B2 * | 4/2010 | Tsai et al. | 362/147 |
| 7,700,958 B2 * | 4/2010 | Nishi et al. | 257/88 |
| 7,737,629 B2 * | 6/2010 | Okuyama et al. | 313/506 |
| 7,786,491 B2 * | 8/2010 | Ueda et al. | 257/81 |
| 7,789,529 B2 * | 9/2010 | Roberts et al. | 362/249.02 |
| 7,821,027 B2 * | 10/2010 | Shin et al. | 257/100 |

(Continued)

FOREIGN PATENT DOCUMENTS

DE   10 2006 033894 A1   6/2007

(Continued)

*Primary Examiner* — N Drew Richards
*Assistant Examiner* — Ankush Singal
(74) *Attorney, Agent, or Firm* — Birch, Stewart, Kolasch & Birch, LLP

(57) ABSTRACT

A lighting device is provided. The lighting device comprises a first substrate and a plurality of second substrates. The plurality of second substrates are separately and electrically connected to the first substrate and comprise a light emitting device.

20 Claims, 2 Drawing Sheets

U.S. PATENT DOCUMENTS

| | | | |
|---|---|---|---|
| 7,830,356 B2 * | 11/2010 | Lee et al. | 345/102 |
| 7,939,836 B2 * | 5/2011 | Yoneda et al. | 257/88 |
| 7,948,770 B2 * | 5/2011 | Lin et al. | 361/806 |
| 8,009,247 B2 * | 8/2011 | Oku et al. | 349/69 |
| 8,030,670 B2 * | 10/2011 | Kim et al. | 257/88 |
| 2002/0175621 A1 | 11/2002 | Song et al. | |
| 2003/0016543 A1 * | 1/2003 | Akiyama | 362/499 |
| 2003/0184217 A1 * | 10/2003 | Yamazaki et al. | 313/505 |
| 2003/0193789 A1 * | 10/2003 | Karlicek, Jr. | 361/760 |
| 2004/0075399 A1 * | 4/2004 | Hall | 315/291 |
| 2005/0040762 A1 * | 2/2005 | Kurihara | 313/512 |
| 2005/0056855 A1 * | 3/2005 | Lin et al. | 257/98 |
| 2005/0104204 A1 * | 5/2005 | Kawakubo et al. | 257/724 |
| 2005/0110426 A1 * | 5/2005 | Shao | 315/185 R |
| 2005/0161771 A1 | 7/2005 | Suehiro et al. | |
| 2005/0174048 A1 * | 8/2005 | Matsukaze | 313/506 |
| 2005/0189556 A1 * | 9/2005 | Yasuda et al. | 257/99 |
| 2005/0242707 A1 * | 11/2005 | Hwang | 313/497 |
| 2005/0253156 A1 * | 11/2005 | Horio et al. | 257/94 |
| 2005/0265051 A1 | 12/2005 | Yamamoto et al. | |
| 2006/0006406 A1 * | 1/2006 | Kim et al. | 257/100 |
| 2006/0054913 A1 * | 3/2006 | Hadame et al. | 257/99 |
| 2006/0160409 A1 * | 7/2006 | Shimizu et al. | 439/490 |
| 2006/0171135 A1 * | 8/2006 | Ishizaka et al. | 362/11 |
| 2006/0193132 A1 * | 8/2006 | Kim et al. | 362/231 |
| 2006/0197474 A1 * | 9/2006 | Olsen | 315/312 |
| 2006/0231842 A1 * | 10/2006 | Hirakata et al. | 257/72 |
| 2006/0232969 A1 * | 10/2006 | Bogner et al. | 362/252 |
| 2007/0013647 A1 * | 1/2007 | Lee et al. | 345/102 |
| 2007/0023893 A1 * | 2/2007 | Shin et al. | 257/713 |
| 2007/0115662 A1 | 5/2007 | Roberts et al. | |
| 2007/0115682 A1 * | 5/2007 | Roberts et al. | 362/555 |
| 2007/0120132 A1 * | 5/2007 | Maruyama et al. | 257/79 |
| 2007/0236447 A1 * | 10/2007 | Lee et al. | 345/102 |
| 2007/0236626 A1 * | 10/2007 | Koganezawa | 349/61 |
| 2007/0247414 A1 * | 10/2007 | Roberts | 345/102 |
| 2008/0025024 A1 * | 1/2008 | Yu | 362/252 |
| 2008/0048496 A1 * | 2/2008 | Fisher et al. | 307/18 |
| 2008/0116782 A1 * | 5/2008 | Kim et al. | 313/496 |
| 2008/0259252 A1 * | 10/2008 | Tanaka et al. | 349/69 |
| 2009/0116223 A1 | 5/2009 | Hamada | |
| 2009/0168396 A1 * | 7/2009 | Moriyasu et al. | 362/84 |
| 2010/0039806 A1 * | 2/2010 | Roberts et al. | 362/231 |
| 2011/0026224 A1 * | 2/2011 | Ioki et al. | 361/695 |

FOREIGN PATENT DOCUMENTS

| | | |
|---|---|---|
| JP | 2006-054209 A * | 2/2006 |
| JP | 2006-54210 A | 2/2006 |
| KR | 20-0390856 A | 7/2005 |
| KR | 20-0390856 Y1 | 7/2005 |
| KR | 10-2005-0116373 A | 12/2005 |
| KR | 10-2006-0114545 A | 11/2006 |
| WO | WO-2006-003563 A2 | 1/2006 |
| WO | WO-2007-037036 A1 | 4/2007 |
| WO | WO-2007-078103 A1 | 7/2007 |

* cited by examiner

[Fig. 1]
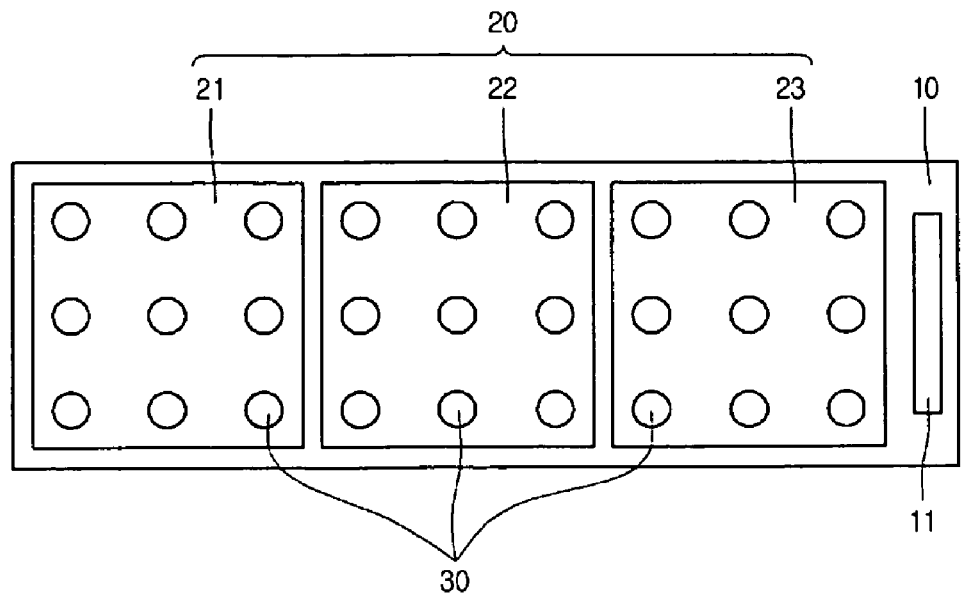
[Fig. 2]
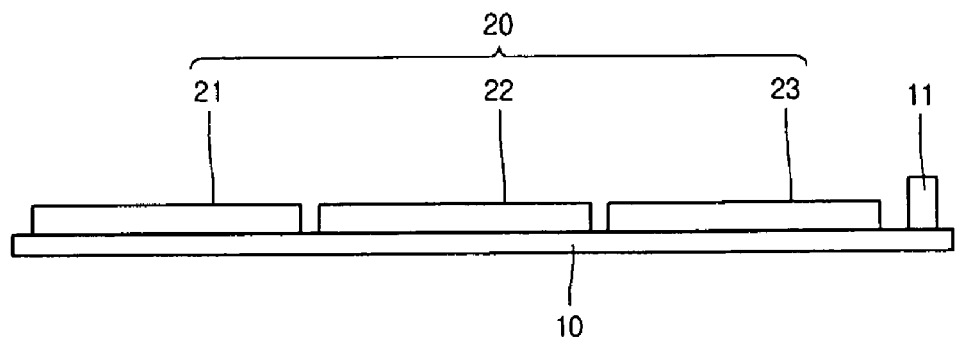
[Fig. 3]
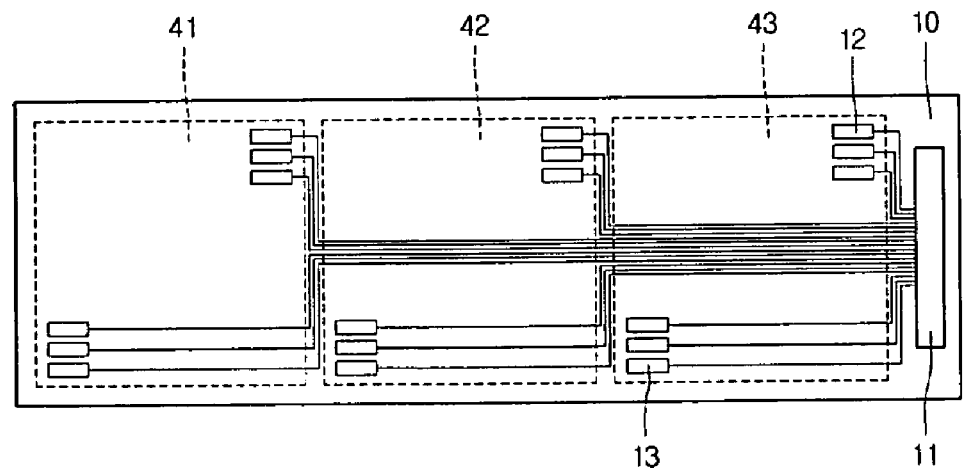

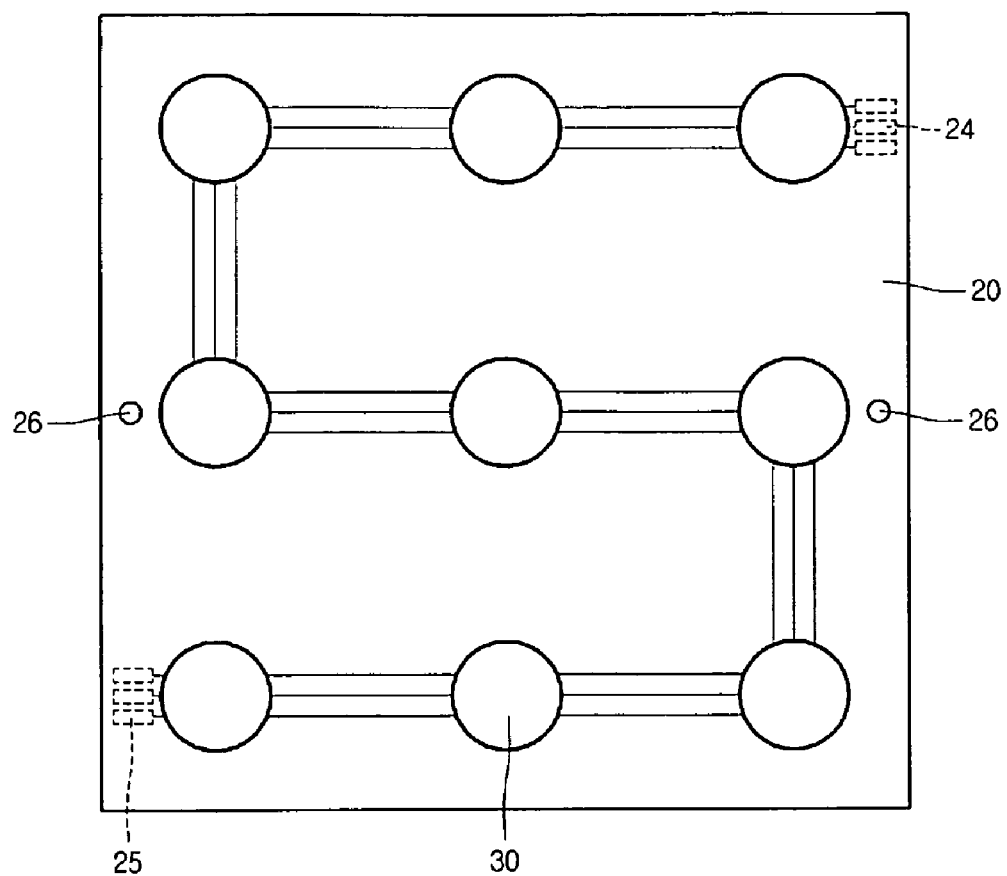
[Fig. 4]

LIGHTING DEVICE

TECHNICAL FIELD

The present disclosure relates to a lighting device.

BACKGROUND ART

A liquid crystal display (LCD) is being used in various electronic devices such as a computer monitor, a television, a mobile communication terminal, and a navigation device. The LCD includes a backlight unit that supplies light to the LCD on a bottom surface thereof because the LCD is a non-luminous display device.

In the backlight unit, a cold cathode fluorescent lamp has been widely used as a light source, but recently, a light emitting diode (LED) is widely used as the light source.

The LED is being used as the backlight unit of the LCD as well as a lighting device of various apparatuses requiring light.

DISCLOSURE OF INVENTION

Technical Problem

Embodiments provide a lighting device.

Embodiments also provide a lighting device that can separately drive a plurality of substrates including a light emitting device.

Embodiments also provide a light device that can easily manufacture and easily repair in case of occurrence of defect.

Technical Solution

In an embodiment, a lighting device comprises: a first substrate; and a plurality of second substrates on the first substrate, the plurality of second substrates being separately and electrically connected to the first substrate and comprising a light emitting device.

In an embodiment, a lighting device comprises: a first substrate comprising a connector connected to an external power source or driver and an interconnection connected to the connector; and a second substrate on the first substrate, the second substrate being electrically connected to the first substrate and comprising a plurality of light emitting devices.

Advantageous Effects

Embodiments can provide a lighting device.

Embodiments can also provide a lighting device that can separately drive a plurality of substrates including a light emitting device.

Embodiments can also provide a light device that can easily manufacture and easily repair in case of occurrence of defect.

BRIEF DESCRIPTION OF THE DRAWINGS

FIG. 1 is a plan view of a lighting device according to an embodiment.

FIG. 2 is a side view of a lighting device according to an embodiment.

FIG. 3 is a view of a first substrate in a lighting device according to an embodiment.

FIG. 4 is a view of a second substrate in a lighting device according to an embodiment.

MODE FOR THE INVENTION

In the following description according to the present disclosure, it will be understood that when a layer (or film), a region, a pattern, or a structure is referred to as being "on/under" another substrate, layer (film), region, pad, or pattern, it can be directly on the other layer or substrate, or intervening layers may also be present.

Also, thicknesses or dimensions of layers may be exaggerated, omitted, or schematically illustrated in the accompanying drawings for convenience and clarity. The dimension of each component in the drawings does not reflect an actual dimension thereof.

Hereinafter, a lighting device according to an embodiment will be described in detail with reference to accompanying drawings.

FIG. 1 is a plan view of a lighting device according to an embodiment, and FIG. 2 is a side view of a lighting device according to an embodiment.

Referring to FIGS. 1 and 2, a lighting device includes a first substrate 10 and a second substrate 20 disposed on the first substrate 10.

The first substrate 10 includes a connector 11 connected to an external power source or driver. The second substrate 20 is electrically connected to the external power source or driver through the connector 11.

The second substrate 20 may be provided in plurality and coupled to the first substrate 10. Three second substrates 21, 22, and 23 are illustrated as examples in FIG. 1.

The second substrate 20 includes a light emitting device 30. The lighting device 30 may be provided in plurality. For example, each of the second substrates 21, 22, and 23 includes nine lighting devices 30 in FIG. 1.

A light emitting diode (LED) emitting white light may be used as the light emitting device 30, and a combination of LEDs emitting red, green and blue light may be used.

The second substrates 21, 22, and 23 are separately connected to the connector 11 disposed on the first substrate 10.

Accordingly, the light emitting devices 30 disposed in the second substrate 20 can be separately controlled through the connector 11 disposed on the first substrate 10.

FIG. 3 is a view of a first substrate in a lighting device according to an embodiment.

A connector 11 is disposed on a side of a first substrate 10. A first electrode 12 and a second electrode 13 are disposed in each of regions 41, 42, and 43 in which a plurality of second substrates 21, 22, and 23 will be disposed respectively.

Each of the first and second electrodes 12 and 13 is connected to the connector 11 through an interconnection.

Since the embodiment exemplarily illustrates that a light emitting device 30 includes LEDs respectively emitting red, green and blue light, three first electrodes 12 and three second electrodes 13 are disposed in each of the regions 41, 42, and 43 in which the plurality of second substrates 21, 22, and 23 will be disposed respectively.

FIG. 4 is a view of a second substrate in a lighting device according to an embodiment.

A third electrode 24 and a fourth electrode 25 electrically connected to a first electrode 12 and a second electrode 13, respectively, are disposed on a bottom surface of a second substrate 20.

Provided is a plurality of light emitting devices 30 electrically connected to the third electrode 24 and the fourth electrode 25 through an interconnection disposed on the second substrate and/or a via hole in which a conductive material is filled.

Since the embodiment exemplarily illustrates that each of the light emitting devices 30 includes LEDs respectively emitting red, green and blue light, three third electrodes 24 and three fourth electrodes 25 are disposed on the bottom surface of each second substrate 20.

Also, although the embodiment exemplarily illustrates that the plurality of light emitting devices 30 is connected in series, the embodiment may be connected in parallel, and thus, a shape of the interconnection may be changed.

In lighting device as described above, the connector 11 is electrically connected to an external power source or driver, and the connector 11 is electrically connected to the first electrode 12 through the interconnection disposed on the first substrate 10.

The first electrode 12 is electrically connected to the third electrode 24 disposed on a side of the bottom surface of the second substrate 20. The third electrode 24 is electrically connected to the fourth electrode 25 disposed on a side of the bottom surface of the second substrate 20 through the interconnection disposed on a top surface of the second substrate 20 and the light emitting device 30.

The third electrode 24 and the fourth electrode 25 may be electrically connected to the interconnection disposed on the second substrate 20 through a via hole in which a conductive material is filled. Also, the first electrode 12 and the second electrode 13 are coupled and electrically connected to the third electrode 24 and the fourth electrode 25 through a solder, respectively.

The fourth electrode 25 is electrically connected to the second electrode 13 disposed on the first substrate 10. The second electrode 13 is electrically connected to the connector 11 through the interconnection disposed on the first substrate 10.

The second substrate 20 may include a plurality of screw holes 26. A plurality of screws is inserted into the plurality of screw holes 26, respectively, to firmly fix the first substrate 10 to the second substrate 20.

The lighting device according to an embodiment may include the first substrate 10 and the plurality of second substrates 20 disposed on the first substrate 10.

The plurality of second substrates 20 is separately connected to the connector 11 disposed on the first substrate 10. Accordingly, driving signals may be separately applied to the plurality of second substrates 20.

For example, if it is assumed that brightness of light emitted from one substrate 21 of the plurality of second substrates 20 has a numerical value of 100, brightness of light emitted from another substrate 22 of the plurality of second substrates 20 can be adjusted to a numerical value of 90.

Also, brightness of light emitted from further another substrate 23 of the plurality of second substrates 20 can be adjusted to a numerical value of 50.

Thus, it is possible to adequately control a total brightness or a partial brightness of the lighting device according to an application of the lighting device.

In the lighting device according to the embodiments, when defect occurs in the light emitting device 30 disposed on any one substrate 21 of the plurality of second substrates 20, a repair work can be easily performed and repair costs and time can be reduced because the substrate 21 including the light emitting device 30 in which the defect occurs can be removed, and then, replaced with another substrate.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

INDUSTRIAL APPLICABILITY

Embodiments can be applied to the lighting device of various electrical equipment.

The invention claimed is:

1. A lighting device comprising:
   a first substrate; and
   a plurality of second substrates on the first substrate, the second substrates being separately and electrically connected to the first substrate and comprising a plurality of light emitting devices,
   wherein the second substrates comprise a third electrode and a fourth electrode electrically connected to the first substrate on sides of a bottom surface of the second substrate, and
   wherein the third electrode and the fourth electrode are electrically connected to the plurality of light emitting devices through an interconnection disposed on the second substrate and/or a via hole in which a conductive material is filled in the second substrate.

2. The lighting device according to claim 1, wherein the first substrate comprises a connector connected to an external power source or driver.

3. The lighting device according to claim 1, wherein each of the plurality of light emitting devices comprises a light emitting diode emitting at least one light of white light, red light, green light, and blue light.

4. The lighting device according to claim 1, wherein the plurality of light emitting devices is connected to each other in series or parallel.

5. The lighting device according to claim 1, wherein the plurality of light emitting devices is disposed on the second substrate and are connected to each other in series through interconnection on the second substrate.

6. The lighting device according to claim 1, wherein driving signals are separately applied to the plurality of second substrates.

7. A lighting device comprising:
   a first substrate comprising a connector connected to an external power source or driver and an interconnection connected to the connector; and
   a second substrate on the first substrate, the second substrate being electrically connected to the first substrate and comprising a plurality of light emitting devices,
   wherein the interconnection disposed on the first substrate comprises a first electrode and a second electrode, the second substrate comprises a third electrode and a fourth electrode correspondingly and electrically connected to the first electrode and the second electrode, and wherein the third electrode, the plurality of light emitting devices, and the fourth electrode are connected to each other in series.

8. The lighting device according to claim 2, wherein the first substrate comprises a first electrode and a second electrode electrically connected to the connector through an interconnection and electrically connected to the second substrate.

9. The lighting device according to claim 7, wherein the second substrate is provided in plurality and disposed on the first substrate.

10. The lighting device according to claim 7, wherein the second substrate comprises a screw hole, and a screw is inserted through the screw hole to couple the second substrate to the first substrate.

11. The lighting device according to claim 7, wherein the plurality of light emitting devices emitting same light on the second substrate is connected to each other in series.

12. The lighting device according to claim 9, wherein the plurality of second substrates is separately controlled through the connector disposed on the first substrate.

13. The lighting device according to claim 9, wherein the plurality of light emitting devices is disposed on the second substrate and are connected to each other in series through interconnection on the second substrate.

14. The lighting device according to claim 9, wherein driving signals are separately applied to the plurality of second substrates.

15. A lighting device comprising:
a first substrate comprising a connector connected to an external power source or driver and an interconnection connected to the connector; and
a second substrate on the first substrate, the second substrate being electrically connected to the first substrate and comprising a plurality of light emitting devices,
wherein the interconnection disposed on the first substrate comprises a first electrode and a second electrode, and the second substrate comprises a third electrode and a fourth electrode correspondingly and electrically connected to the first electrode and the second electrode, and
wherein the third electrode and the fourth electrode are electrically connected to the plurality of light emitting devices through the interconnection disposed on the second substrate and/or a via hole in which a conductive material is filled in the second substrate.

16. The lighting device according to claim 15, wherein the second substrate is provided in plurality and disposed on the first substrate.

17. The lighting device according to claim 15, wherein the plurality of light emitting devices emitting same light on the second substrate is connected to each other in series.

18. The lighting device according to claim 16, wherein the plurality of second substrates is separately controlled through the connector disposed on the first substrate.

19. The lighting device according to claim 16, wherein the plurality of light emitting devices is disposed on the second substrate and are connected to each other in series through interconnection on the second substrate.

20. The lighting device according to claim 16, wherein driving signals are separately applied to the plurality of second substrates.

* * * * *